United States Patent
Im et al.

(10) Patent No.: US 8,698,395 B2
(45) Date of Patent: Apr. 15, 2014

(54) ORGANIC LIGHT EMITTING DISPLAY WITH ORGANIC CAPPING LAYER HAVING A SPECIFIC REFRACTIVE INDEX

(75) Inventors: Ja-Hyun Im, Suwon-si (KR); Kwan-Hee Lee, Suwon-si (KR); Seoung-Yoon Ryu, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 1029 days.

(21) Appl. No.: 11/288,769

(22) Filed: Nov. 28, 2005

(65) Prior Publication Data

US 2006/0113907 A1 Jun. 1, 2006

(30) Foreign Application Priority Data

Nov. 26, 2004 (KR) .................. 10-2004-0098238

(51) Int. Cl.
*H01L 51/50* (2006.01)
(52) U.S. Cl.
USPC .......................................... 313/512; 313/504
(58) Field of Classification Search
None
See application file for complete search history.

(56) References Cited

U.S. PATENT DOCUMENTS

| | | | |
|---|---|---|---|
| 5,837,166 A | 11/1998 | Kawamura et al. | |
| 5,844,363 A * | 12/1998 | Gu et al. | 313/506 |
| 6,074,734 A | 6/2000 | Kawamura et al. | |
| 6,541,908 B1 * | 4/2003 | Cheung et al. | 313/503 |
| 6,660,409 B1 | 12/2003 | Komatsu et al. | |
| 7,268,484 B2 * | 9/2007 | Nakamura | 313/501 |
| 2003/0048072 A1 | 3/2003 | Ishihara et al. | |
| 2004/0054174 A1 * | 3/2004 | Nakaya et al. | 544/99 |
| 2004/0061121 A1 * | 4/2004 | Uchida | 257/82 |
| 2004/0140762 A1 | 7/2004 | Tohma et al. | |
| 2005/0040762 A1 * | 2/2005 | Kurihara | 313/512 |
| 2005/0110400 A1 * | 5/2005 | Nakamura | 313/506 |
| 2006/0022585 A1 * | 2/2006 | Aziz | 313/504 |
| 2006/0022590 A1 * | 2/2006 | Aziz et al. | 313/506 |
| 2006/0250084 A1 * | 11/2006 | Cok et al. | 313/512 |
| 2007/0020451 A1 * | 1/2007 | Padiyath et al. | 428/336 |
| 2007/0222378 A1 * | 9/2007 | Nakamura | 313/507 |
| 2008/0023724 A1 * | 1/2008 | Takeda et al. | 257/103 |
| 2008/0122348 A1 * | 5/2008 | Jeong et al. | 313/504 |

FOREIGN PATENT DOCUMENTS

| | | |
|---|---|---|
| EP | 1102317 A2 * | 5/2001 |
| EP | 1 435 761 A1 | 7/2004 |
| FR | 2 845 204 | 4/2004 |

(Continued)

OTHER PUBLICATIONS

"DuPont™ Kapton® Polyimide Film Specifications", [online], [retrieved on May 14, 2007] <URL: http://www.boedeker.com/kapton_p.htm/>.*

(Continued)

*Primary Examiner* — Britt D Hanley
(74) *Attorney, Agent, or Firm* — Christie, Parker & Hale, LLP

(57) ABSTRACT

An organic light emitting diode (OLED) display and a method for fabricating the same. The OLED display includes: a substrate; a first electrode formed on the substrate and including a reflecting layer; an organic layer formed on the first electrode and including at least an organic emission layer; a second electrode formed on the organic layer; and an organic capping layer formed on the second electrode. The organic capping layer is formed by stacking an organic material having a refractive index of 1.7 or more, thereby providing a high-efficiency and long-life top-emitting OLED display.

24 Claims, 3 Drawing Sheets

(56) References Cited

FOREIGN PATENT DOCUMENTS

| FR | 2 845 204 A1 | 4/2004 | |
|---|---|---|---|
| JP | 2002-231443 | 8/2002 | |
| JP | 2004-220874 | 8/2004 | |
| JP | 2004-281189 | 10/2004 | |
| JP | 2006-004721 | 1/2006 | |
| KR | 10-2002-0044565 A | 6/2002 | |
| KR | 10-2005-0022991 A | 3/2005 | |
| KR | 10-2005-0024592 A | 3/2005 | |
| WO | WO 03/047317 A1 * | 6/2003 | ............ H05B 33/22 |

OTHER PUBLICATIONS

Application of an ultrathin LiFÖAl bilayer in organic surface-emitting diodes; L. S. Hung C. W. Tang, M. G. Mason, P. Raychaudhuri, and J. Madathil; Appl. Phys. Lett., vol. 78, No. 4, Jan. 22, 2001; p. 544-546.*

Transparent organic light-emitting devices withLiF/Mg:Ag cathode; B. J. Chen, X. W. Sun, and S. C. Tan; Feb. 7, 2005 / vol. 13, No. 3 / Optics Express; p. 937-941.*

Tuning the emission characteristics of top-emitting organic light-emitting devices by means of a dielectric capping layer: An experimental and theoretical study H. Riel, S. Karg, T. Beierlein, W. Riess, and K. Neyts, J. Appl. Phys. 94, 5290 (2003), DOI:10.1063/1.1605256.*

Phosphorescent top-emitting organic light-emitting devices with improved light outcoupling H. Riel, S. Karg, T. Beierlein, B. Ruhstaller, and W. Riess, Appl. Phys. Lett. 82, 466 (2003), DOI:10.1063/1.1537052.*

Methodology for optimizing viewing characteristics of top-emitting organic light-emitting devices Chung-Chih Wu, Chun-Liang Lin, Ping-Yuan Hsieh, and Huo-Hsien Chiang, Appl. Phys. Lett. 84, 3966 (2004), DOI:10.1063/1.1745107.*

Improved light outcoupling for phosphorescent top-emitting organic light-emitting devices Shufen Chen, Yi Zhao, Gang Cheng, Jiang Li, Chunli Liu, Zhenyuan Zhao, Zhonghai Jie, and Shiyong Liu, Appl. Phys. Lett. 88, 153517 (2006), DOI:10.1063/1.2190274.*

Effect of 2,9-dimethyl-4,7-diphenyl-1,10-phenanthroline outcoupling layer on electroluminescent performances in top-emitting organic light-emitting devices Shufen Chen, Wenfa Xie, Yanlong Meng, Ping Chen, Yi Zhao, and Shiyong Liu, J. Appl. Phys. 103, 054506 (2008), DOI:10.1063/1.2885175.*

Highly efficient top emitting organic light-emitting diodes with organic outcoupling enhancement layers Qiang Huang, Karsten Walzer, Martin Pfeiffer, Vadim Lyssenko, Gufeng He, and Karl Leo, Appl. Phys. Lett. 88, 113515 (2006), DOI:10.1063/1.2185468.*

Zhiyuan Xie, Liang-Sun Hung, Furong Zhu, A flexible top-emitting organic light-emitting diode on steel foil, Chemical Physics Letters, vol. 381, Issues 5-6, Nov. 21, 2003, pp. 691-696, ISSN 0009-2614, DOI: 10.1016/j.cplett.2003.09.147.*

Zhiyuan Xie, Liang-Sun Hung, Furong Zhu, A flexible top-emitting organic light-emitting diode on steel foil, Chemical Physics Letters, vol. 381, Issues 5-6, Nov. 21, 2003, pp. 691-696, ISSN 0009-2614, 10.1016/j.cplett.2003.09.147. (http://www.sciencedirect.com/science/article/pii/S0009261403016634).*

European Search Report for EP Application No. 05111051.8 dated Apr. 7, 2006.

Hung et al.; *Application of an Ultrathin LiF/Al bilayer in organic surface-emitting diodes*; Applied Physics Letters, vol. 78, No. 4, Jan. 22, 2001, pp. 544 and 546.

Zhang, et al.; *Infrared Refractive Index and Extinction Coefficient of Polyimide Films*; International Journal of Theraphysics, vol. 19, No. J, 1998, pp. 905-916.

Patent Abstracts of Japan, Publication No. 2004-281189, dated Oct. 7, 2004, in the name of Kunio Masushige.

Riel et al., Phosphorescent top-emitting organic light-emitting devices with improved light outcoupling, Applied Physics Letters, Jan. 20, 2003, pp. 466-468, vol. 82, No. 3.

Patent Abstracts of Japan for Publication No. 2002-231443; dated Aug. 16, 2002 in the name of Yuichi Iwase et al.

Korean Patent Abstracts for Publication No. 10-2002-0044565 A; dated Jun. 15, 2002 in the name of Mitsuru Eida et al.

Korean Patent Abstracts for Publication No. 10-2005-0022991 A; dated Mar. 9, 2005 in the name of Jang Hyuk Kwon et al.

Korean Patent Abstracts for Publication No. 10-2005-0024592 A; dated Mar. 10, 2005 in the name of Jin Woo Park.

Office action, including English translation, dated Jul. 4, 2008, for corresponding Chinese Patent Application No. 200510124317.7, indicating the relevance of the cited references.

Japanese Office action dated Oct. 14, 2008, for corresponding Japanese Patent application 2005-341105, noting listed reference in this IDS.

* cited by examiner

ORGANIC LIGHT EMITTING DISPLAY WITH ORGANIC CAPPING LAYER HAVING A SPECIFIC REFRACTIVE INDEX

CROSS-REFERENCE TO RELATED APPLICATION

This application claims priority to and the benefit of Korean Patent Application No. 10-2004-0098238, filed Nov. 26, 2004, the entire content of which is incorporated herein by reference.

BACKGROUND OF THE INVENTION

1. Field of the Invention

The present invention relates to an organic light emitting diode (OLED) display and a method for fabricating the same, and more particularly, to an OLED display and a method for fabricating the same in which an organic capping layer having a refractive index of 1.7 or more is formed on a second electrode of the OLED display.

2. Description of the Related Art

Among flat panel displays, an organic light emitting diode (OLED) display is an emission display that emits light by electrically exciting an organic compound. As used herein OLED display may refer to a single OLED, multiple OLEDs or an OLED display device. The OLED display requires no backlight, which is used in a liquid crystal display (LCD). Accordingly, the OLED display can be formed to be lightweight and compact in a simplified process. The OLED display can be fabricated at low temperatures and has a fast response speed of 1 ms or less and low power consumption. Further, the OLED display has a wide viewing angle and a high contrast ratio because of its self-emission feature.

Typically, since an OLED display includes an organic emission layer between an anode and a cathode, holes supplied from the anode and electrons supplied from the cathode are recombined in the organic emission layer, thereby creating hole-electron pairs, i.e., excitons, which generate energy when being transitioned to a ground state to emit light.

An OLED display may be classified into a bottom-emitting OLED display and a top-emitting OLED display depending on an emitting direction of light that is generated from an organic emission layer. In the bottom-emitting OLED display in which light is emitted toward a substrate, a reflective electrode is formed on an organic emission layer and a transparent electrode is formed beneath the organic emission layer. Here, if the OLED display is an active matrix one, a portion with a thin film transistor formed therein does not transmit light so that a light emitting area is reduced. On the other hand, in the top-emitting OLED display, a transparent electrode is formed on an organic emission layer and a reflective electrode is formed beneath the organic emission layer so that light is emitted in an opposite direction to a substrate side, thereby increasing a light transmitting area and in turn improving luminance.

FIG. 1 is a cross-sectional view showing the structure of a conventional top-emitting OLED display.

Referring to FIG. 1, in the conventional top-emitting OLED display, a first electrode is patterned and formed over a transparent substrate 11 such as glass or plastic. The first electrode includes a reflecting layer 12 formed of a metal having a high reflectivity characteristic such as aluminum (Al) or aluminum-neodymium (Al—Nd). The first electrode is formed of a reflective electrode that further includes a transparent electrode 13 such as Indium Tin Oxide (ITO) or Indium Zinc Oxide (IZO) having a high work function.

An organic layer 15 including at least an organic emission layer is then formed on the first electrode 13 and may further include at least one of a hole injection layer, a hole transport layer, an electron transport layer, and an electron injection layer, in addition to the organic emission layer.

Then, a second electrode 17 is formed on the entire surface of the organic layer 15. The second electrode 17 is formed of a conductive metal having a low work function selected from Mg, Ag, Al, Ca and alloys thereof. The second electrode 17 may be formed of a transmissive electrode with a small thickness such that light is transmitted or of a transparent electrode such as ITO or IZO.

A passivation layer 19 is formed on the second electrode 17. The passivation layer 19 may be formed by stacking an inorganic material or an organic material. In one embodiment, the passivation layer 19 is formed to a certain thickness using an inorganic layer such as a silicon nitride (SiNx) layer to protect the second electrode and the organic emission layer from external moisture and contamination.

In a conventional OLED display, the passivation layer is formed of an inorganic or organic material on the second electrode to protect the second electrode and the organic emission layer from external moisture and contamination after the second electrode, which is a transmissive electrode, is deposited. However, as the passivation layer is deposited without any consideration of its refractive index and thickness, the top-emitting OLED display degrades in efficiency.

SUMMARY OF THE INVENTION

The embodiments of the present invention provide an OLED display with high efficiency and long lifetime by depositing an organic capping layer having a refractive index of at least 1.7 on a second electrode.

In an exemplary embodiment of the present invention, an OLED display includes: a substrate; a first electrode formed on the substrate and including a reflecting layer; an organic layer formed on the first electrode and including at least organic emission layer; a second electrode formed on the organic layer; and an organic capping layer formed on the second electrode. The organic capping layer has a refractive index of at least 1.7.

In another exemplary embodiment of the present invention, a method for fabricating an OLED display includes: preparing a substrate; forming a first electrode including a reflecting layer on the substrate; forming an organic layer including at least an organic emission layer over the first electrode; forming a second electrode on the organic layer; and forming an organic capping layer having a refractive index of 1.7 or more on the second electrode.

BRIEF DESCRIPTION OF THE DRAWINGS

The above and other features and aspects of the present invention will become more apparent to those of ordinary skill in the art by describing in detail example embodiments thereof with reference to the attached drawings in which.

DETAILED DESCRIPTION OF THE INVENTION

Hereinafter, embodiments of the present invention will be described with reference to the accompanying drawings.

Figure 1:
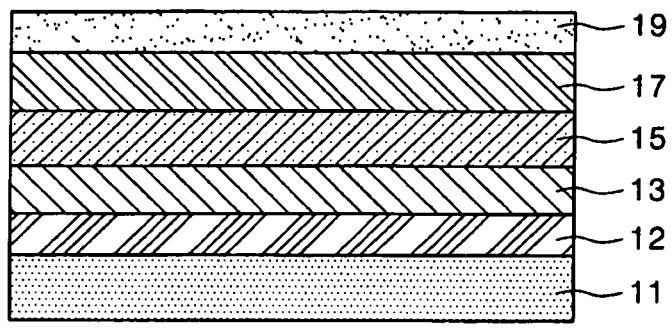
FIG. 1 is a cross-sectional view showing the structure of a conventional top-emitting OLED display.
Figure 2:
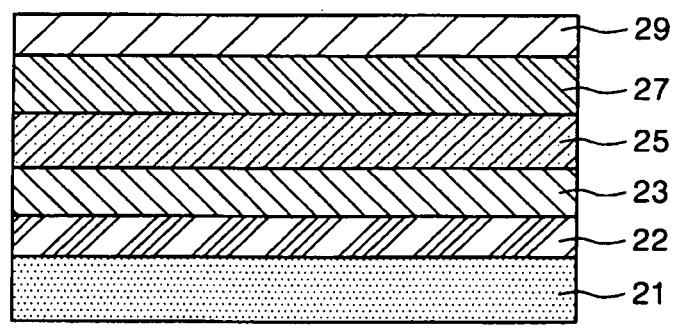
FIG. 2 is a cross-sectional view showing the structure of a top-emitting OLED display according to an embodiment of the present invention.

FIG. 2 is a cross-sectional view showing the structure of a top-emitting OLED display according to one embodiment of the present invention.

Referring to FIG. 2, in the OLED display according to one embodiment of the present invention, a first electrode including a reflecting layer 22 is patterned and formed on a substrate 21 such as glass, plastic and/or crystal. The reflecting layer 22 is formed of a high-reflective metal such as aluminum or an aluminum alloy. The first electrode is formed of a reflective electrode that is a transparent electrode 23 such as Indium Tin Oxide (ITO) or Indium Zinc Oxide (IZO) having a high work function.

An organic layer 25 including at least an organic emission layer is then formed on the first electrode. The organic layer 25 may further include at least one of a hole injection layer, a hole transport layer, an electron transport layer, and an electron injection layer, in addition to the organic emission layer.

A second electrode 27 is formed on the organic layer 25. The second electrode 27 is formed of a transparent electrode such as ITO or IZO, and/or of a transmissive electrode having a small thickness that can transmit light, which may be made from Mg, Ag, Al, Ca and/or alloys thereof that are conductive metals having a low work function.

By way of example, the second electrode 27 may be formed of Mg, Ag, Al, Ca and/or alloys thereof, and of a transmissive electrode having a small thickness that can transmit light. In one example embodiment, the second electrode 27 is formed of MgAg.

An organic capping layer 29 is formed on the second electrode 27. The organic capping layer 29 is formed to prevent a significant amount of light from being lost due to total reflection when the second electrode 27 is formed in the top-emitting OLED display. The organic capping layer 29 is formed by stacking an organic material having a refractive index of 1.7 or more to a predetermined thickness. The organic capping layer 29 may be formed of an arylenediamine derivative, a triamine derivative, CBP, and/or aluminum quinolate (Alq3). In one embodiment, the organic capping layer 29 may be formed of an arylenediamine derivative having a refractive index of 1.7 to 2.4.

Figure 3:
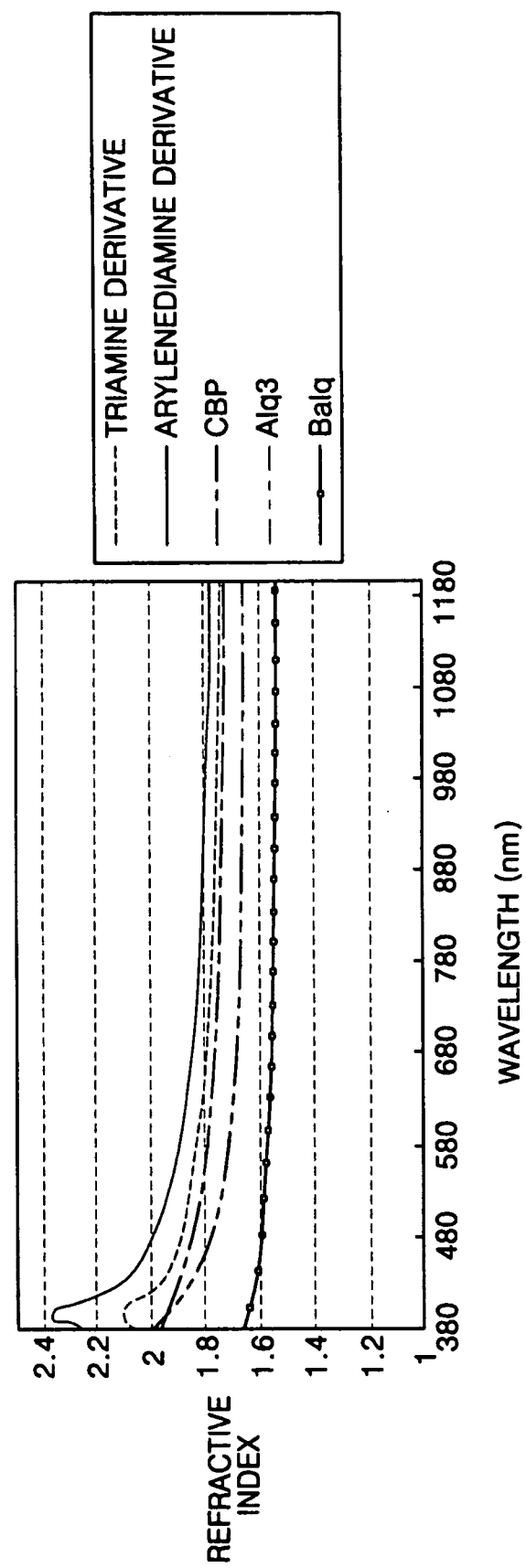
FIG. 3 is a graph showing a refractive index depending on a wavelength for each organic material according to an embodiment of the present invention.

FIG. 3 is a graph showing a refractive index depending on a wavelength for each organic material according to an embodiment of the present invention.

As seen from FIG. 3, the triamine derivative has a refractive index of at least 1.7 to 2.1, arylenediamine derivative of at least 1.7 to 2.4, CBP 1.7 to 2.0, Alq3 1.7 to 2.0, and BIaq 1.5 to 1.7 in a range of wavelengths of 380 nm to 1190 nm.

With the 1.7 or more refractive index, the organic material for forming the organic capping layer 29 prevents total reflection of light to increase the luminous efficiency of red (R), green (G), and blue (B) light. In one embodiment, the organic material has a refractive index close to 2.4.

Further, in one embodiment of the present invention, the organic capping layer 29 is formed by stacking a material having a refractive index of 1.7 or more to a thickness of 300 Å ($1 \times 10^{-8}$ cm) to 900 Å to maximize luminous efficiency on each color coordinate of R, G and B.

If the organic capping layer 29 is 300 Å to 900 Å thick, it can be used as an element due to the luminous efficiency of R, G and B, and can increase the luminous efficiency of R, G and B and reduce power consumption.

In one embodiment, the organic capping layer 29 is deposited to a thickness of 600 Å to maximize the luminous efficiency of R, G and B and minimize power consumption.

A method for fabricating a top-emitting OLED display according to embodiments of the present invention will be now described.

Referring back to FIG. 2, a substrate 21 is prepared. The substrate 21 is a transparent substrate, such as glass, plastic and/or crystal.

A first electrode and a reflecting layer 22 are then formed on the substrate 21. The reflecting layer 22 and the first electrode are deposited by sputtering, ion plating, or the like. The reflecting layer 22 and the first electrode may be deposited by the sputtering method and patterned using photoresist (PR) patterned in a photolithography process as a mask.

An organic layer 25 including at least an organic emission layer is then formed on the first electrode.

The organic emission layer may include a small molecular or polymer material.

The small molecular material is formed of Alq3, anthracene, cyclo pentadiene, BeBq2, Almq, ZnPBO, Balq, DPVBi, BSA-2 and/or 2PSP. In one embodiment, the organic emission layer is formed of Alq3. The polymer material is formed of polyphenylene (PPP) and/or a derivative thereof, poly p-phenylenevinylene (PPV) and/or a derivative thereof and/or polythiophene (PT) and/or a derivative thereof.

If the first electrode is an anode, the organic layer 25 may further include a hole injection layer, a hole transport layer, an electron transport layer, and an electron injection layer, in addition to the organic emission layer.

The hole injection layer is formed of copper phthalocyanine (CuPc), PEDOT, m-MTDATA, and/or triphenylamine. The hole transport layer includes at least one hole transport compound, e.g., aromatic tertiary amine. This compound contains at least one trivalent nitrogen atom combined only to carbon atoms (at least one of the carbon atoms is an element of an aromatic ring). In one form, the aromatic tertiary amine may be arylamine, e.g., monoarylamine, diarylamine, triarylamine, or polymeric arylamine.

In one embodiment, a material useful for forming the electron transport layer is a metal chelated oxynoide compound containing chelate of oxyn itself (commonly referred to as '8-quinolinol' or '8-hydroxy quinoline'). Such a compound helps electron injection and transport and provides high performance, and is easily fabricated in the form of a thin film. Butadiene derivative and heterocyclic optical brighteners are contained in other electron transport materials. Benzazole and triazine are also useful as the electron transport material. Further, when a dopant is applied to the emission layer, Alq3, used as a host material of the emission layer, is widely used because of its feature as an electron transporter.

The organic layer 25 is deposited by vacuum deposition, spin coating, inkjet printing, doctor blade, laser induced thermal imaging (LITI), or the like.

Meanwhile, the organic layer 25 may be patterned and formed in each unit pixel. The organic layer 25 may be patterned by laser induced thermal imaging, vacuum deposition using a shadow mask, or the like.

A second electrode 27 is then formed on the entire surface of the organic layer 25. The second electrode 27 is formed by vacuum deposition.

An organic capping layer 29 is formed on the second electrode 27. The organic capping layer 29 is formed by vacuum deposition so that deterioration is minimized due to thermal damage of the organic emission layer. As such, the use of the organic capping layer can minimize lifetime reduction and dark spot generation due to thermal damage of the organic emission layer, which may be caused when an inorganic layer having a similar characteristic is formed at high temperature by sputtering. Further, the deposition of the organic capping layer in optimal conditions leads to increased efficiency over about 1.5 times, thereby increasing the lifetime of the top-emitting OLED display. As a result, it is possible to obtain a high-efficiency and long-lifetime top-emitting OLED display.

The substrate including the organic capping layer 29 is encapsulated with an upper substrate by a typical method, thereby completing the top-emitting OLED display.

Embodiments of the present invention will be now described. However, the following embodiments are disclosed for illustrative purposes only so that the present invention is easily understood and not intended to limit the present invention.

Embodiments 1 to 4 and Comparative Example

In Embodiments 1 to 4 and the Comparative example, a test substrate for a top-emitting OLED display was fabricated.

Embodiment 1

A glass substrate was prepared. A reflecting layer of a first electrode was formed of Al on the substrate, and ITO was deposited on the reflecting layer of Al. An organic layer was then formed on the ITO by depositing m-TDATA in a hole injection layer, NPB in a hole transport layer, red-CBP:BT-PIr, green-CBP:Ir ppy 3 and blue-Alq3:DPBVi in an emission layer, Balq in a hole blocking layer, Alq3 in an electron transport layer, and LiF in an electron injection layer. MgAg was deposited as a second electrode, and then an organic capping layer having a thickness of 200 Å was deposited by performing vacuum deposition on an arylenediamine derivative having a 1.7 or more refractive index in conditions of 280 to 300° C. in temperature, about 10e−7 in vacuum and 1 Å/sec in a deposition rate, thus completing the top-emitting OLED display.

Embodiment 2

A top-emitting OLED display was formed as in Embodiment 1 except that an organic capping layer was deposited to a thickness of 400 Å.

Embodiment 3

A top-emitting OLED display was formed as in Embodiment 1 except that an organic capping layer was deposited to a thickness of 600 Å.

Embodiment 4

A top-emitting OLED display was formed as in Embodiment 1 except that an organic capping layer was deposited to a thickness of 800 Å.

COMPARATIVE EXAMPLE

An OLED display including a substrate, a first electrode, an organic layer and a second electrode was completed as in Embodiment 1. In this case, an organic capping layer is not deposited.

<Evaluation of Efficiency and Power Consumption>

R and G efficiencies depending on the thickness of the organic capping layer in the OLED displays formed as in Embodiments 1 to 4 and the comparative example were evaluated.

In the case of B, a change in color coordinates significantly affects total power consumption and, accordingly, an absolute comparison between efficiency values is meaningless. For this reason, both color coordinates and efficiency were considered in evaluating the power consumption.

Table 1 shows an evaluation result of R and G efficiencies and B power consumption for each thickness of the organic capping layer according to an embodiment of the present invention.

Figure 4:
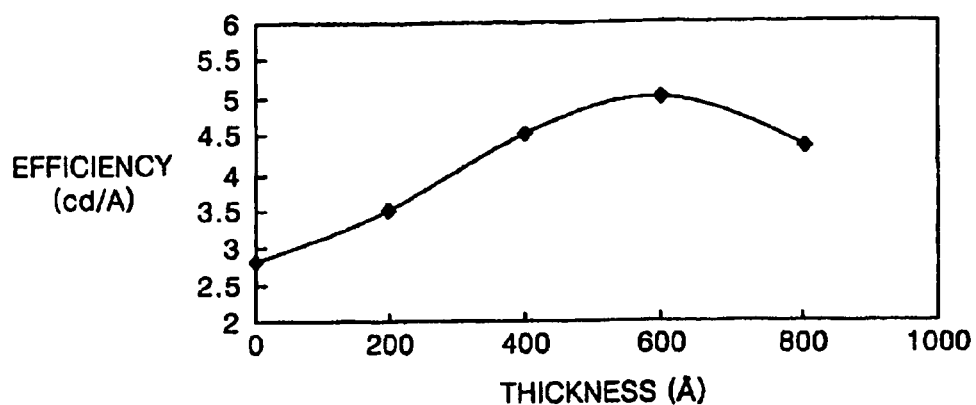
FIG. 4 is a graph showing red (R) efficiency for each thickness of an organic capping layer according to an embodiment of the present invention.
Figure 5:
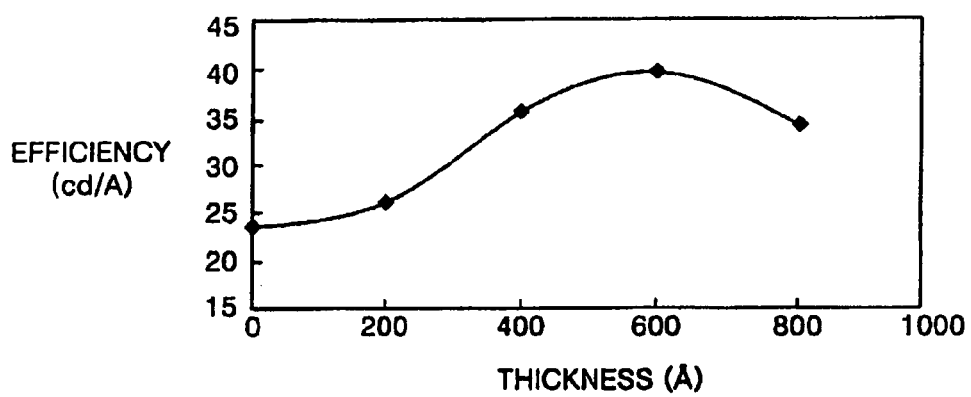
FIG. 5 is a graph showing green (G) efficiency for each thickness of an organic capping layer according to an embodiment of the present invention.
Figure 6:
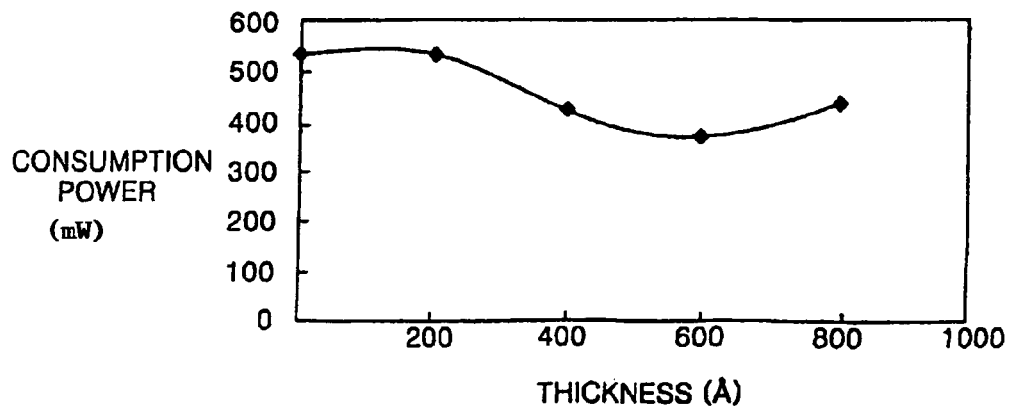
FIG. 6 is a graph showing blue (B) power consumption for each thickness of an organic capping layer according to an embodiment of the present invention.

FIGS. 4 and 5 are graphs that respectively show R and G efficiencies for each thickness of an organic capping layer according to an embodiment of the present invention, respectively, and FIG. 6 is a graph showing B power consumption for each thickness of an organic capping layer according to an embodiment of the present invention.

TABLE 1

|  | Thickness (Å) of organic capping layer | R efficiency, cd/A | G efficiency, cd/A | B power consumption, mW |
| --- | --- | --- | --- | --- |
| Comparative example | 0 | 2.83 | 23.63 | 538.5 |
| Embodiment1 | 200 | 3.52 | 26.30 | 533.7 |
| Embodiment2 | 400 | 4.50 | 35.65 | 422.4 |
| Embodiment3 | 600 | 4.98 | 39.60 | 373.6 |
| Embodiment4 | 800 | 4.34 | 34.33 | 434.9 |

From Table 1 and FIGS. 4 to 6, it was ascertained that when the thickness of the organic capping layer increases from 0 Å to 200 Å, 400 Å and 600 Å as in the comparative examples, and Embodiments 1 to 3, the R efficiency increases from 2.83 candelas per ampere (cd/A) to 4.98 cd/A, the G efficiency increases from 23.63 cd/A to 39.60 cd/A, and the B power consumption is reduced from 538.5 milli-watts (mW) to 373.6 mW.

In particular, it was ascertained that when the organic capping layer has a thickness of 600 Å as in Embodiment 3, the R and G efficiencies are maximized to be 4.98 cd/A and 39.60 cd/A, respectively, and the B power consumption is minimized to be 373.6 mW.

It was also ascertained that if the organic capping layer has a thickness of 800 Å as in Embodiment 4, the R and G efficiencies are reduced to 4.34 cd/A and 34.33 cd/A, respectively, and the B power consumption is increased to 434.9 mW, compared to Embodiment 3.

It was seen from the above that it is beneficial that the organic capping layer is formed by depositing an organic material having a refractive index of 1.7 or higher to a thickness of 600 Å, thereby achieving maximized R, G and B efficiencies and low power consumption. However, other suitable thicknesses may be used for the organic capping layer, as disclosed herein.

As described above, according to the present invention, it is possible to obtain a high-efficiency and long-lifetime top-emitting OLED display by stacking an organic capping layer having a refractive index of 1.7 or more on the second electrode of the top-emitting OLED display.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An organic light emitting diode (OLED) display comprising:
   a substrate;
   a first electrode formed on the substrate, the first electrode including a reflecting layer and a transparent layer;
   an organic layer formed on the first electrode, the organic layer including a hole blocking layer, an electron injection layer, a hole injection layer, a hole transport layer, an electron transport layer, and an organic emission layer, wherein the transparent layer is between the organic layer and the reflecting layer;
   a second electrode formed on the organic layer; and
   an organic capping layer having a thickness of 600 Å formed on the second electrode, the organic capping layer having a refractive index of at least 1.7 and configured to transmit light from the organic layer.

2. The OLED display of claim 1, wherein the organic capping layer has a refractive index of 1.7 to 2.4.

3. An organic light emitting diode (OLED) display comprising:
   a substrate;
   a first electrode formed on the substrate, the first electrode including a reflecting layer;
   an organic layer formed on the first electrode, the organic layer including an organic emission layer;
   a second electrode formed on the organic layer; and
   an organic capping layer formed on the second electrode, the organic capping layer having a refractive index of at least 1.7,
   wherein the organic capping layer is formed of an arylenediamine derivative and/or CBP.

4. The OLED display of claim 1, wherein the organic capping layer is formed by a vacuum deposition method.

5. The OLED display of claim 1, wherein the first electrode is an anode and the second electrode is a cathode.

6. The OLED display of claim 5, wherein the transparent layer is a transparent electrode formed of Indium Tin Oxide or Indium Zinc Oxide.

7. The OLED display of claim 5, wherein the reflecting layer is aluminum or an aluminum alloy.

8. The OLED display of claim 5, wherein the second electrode is formed of Mg, Ag, Al, Ca and/or an alloy of Mg, Ag or Ca, the second electrode being a transmissive electrode having a small thickness.

9. A method for fabricating an organic light emitting diode (OLED) display, comprising:
   preparing a substrate;
   forming a first electrode including a reflecting layer and a transparent layer on the substrate;
   forming an organic layer including a hole blocking layer, an electron injection layer, a hole injection layer, a hole transport layer, an electron transport layer, and an organic emission layer, over the first electrode, wherein the transparent layer is between the organic layer and the reflecting layer;
   forming a second electrode on the organic layer; and
   forming an organic capping layer having a refractive index of at least 1.7 and a thickness of 600 Å on the second electrode and configured to transmit light from the organic layer.

10. The method of claim 9, wherein the organic capping layer has a refractive index of 1.7 to 2.4.

11. A method for fabricating an organic light emitting diode (OLED) display, comprising:
    preparing a substrate;
    forming a first electrode including a reflecting layer on the substrate;
    forming an organic layer including an organic emission layer over the first electrode;
    forming a second electrode on the organic layer; and
    forming an organic capping layer having a refractive index of at least 1.7 on the second electrode,
    wherein the organic capping layer comprises an arylenediamine derivative and/or CBP.

12. The method of claim 9, wherein the organic capping layer is formed by a vacuum deposition method.

13. The method of claim 9, wherein the first electrode is an anode and the second electrode is a cathode.

14. The method of claim 13, wherein the transparent layer is a transparent electrode formed of Indium Tin Oxide (ITO) or Indium Zinc Oxide (IZO).

15. The method of claim 14, wherein the reflecting layer comprises aluminum and/or an aluminum alloy.

16. The method of claim 13, wherein the second electrode comprises Mg, Ag, Al, Ca and/or an alloy of Mg, Ag, Al or Ca, the second electrode being a transmissive electrode having a small thickness.

17. The OLED display of claim 3, wherein the organic capping layer has a thickness of 600 Å.

18. The OLED display of claim 1, wherein the organic capping layer is formed of a triamine derivative, an arylenediamine derivative, CBP, and/or Alq3.

19. The OLED display of claim 1, wherein the second electrode comprises MgAg.

20. The method of claim 9, wherein the second electrode comprises MgAg.

21. The OLED display of claim 1, wherein the organic capping layer is formed of a metal-free organic compound.

22. The OLED display of claim 21, wherein the organic capping layer has a refractive index of 1.7 to 2.4.

23. The method of claim 9, wherein the organic capping layer is formed of a metal-free organic compound.

24. The method of claim 23, wherein the organic capping layer has a refractive index of 1.7 to 2.4.

* * * * *